(12) United States Patent
Han et al.

(10) Patent No.: US 10,410,973 B2
(45) Date of Patent: Sep. 10, 2019

(54) SEMICONDUCTOR DEVICE AND METHOD OF MANUFACTURING THEREOF

(71) Applicant: Amkor Technology, Inc., Tempe, AZ (US)

(72) Inventors: Yi Seul Han, Incheon (KR); Tae Yong Lee, Goyang-si (KR); Ji Yeon Ryu, Incheon (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 16/053,310

(22) Filed: Aug. 2, 2018

(65) Prior Publication Data

US 2018/0342465 A1    Nov. 29, 2018

Related U.S. Application Data

(63) Continuation of application No. 15/469,008, filed on Mar. 24, 2017, now Pat. No. 10,177,095.

(51) Int. Cl.
| | |
|---|---|
| *H01L 23/552* | (2006.01) |
| *H01L 23/00* | (2006.01) |
| *H01L 23/31* | (2006.01) |
| *H01L 23/16* | (2006.01) |

(Continued)

(52) U.S. Cl.
CPC ............ *H01L 23/552* (2013.01); *H01L 21/56* (2013.01); *H01L 23/16* (2013.01); *H01L 23/3128* (2013.01); *H01L 23/3135* (2013.01); *H01L 24/13* (2013.01); *H01L 24/96* (2013.01); *H01L 21/561* (2013.01); *H01L 21/568* (2013.01); *H01L 23/5389* (2013.01); *H01L 24/19* (2013.01); *H01L 2224/02311* (2013.01); *H01L 2224/02379* (2013.01); *H01L 2224/02381* (2013.01); *H01L 2224/0401* (2013.01); *H01L 2224/04105* (2013.01); *H01L 2224/12105* (2013.01); *H01L 2224/96* (2013.01); *H01L 2924/3025* (2013.01)

(58) Field of Classification Search
CPC . H01L 21/568; H01L 21/561; H01L 23/3128; H01L 23/552; H01L 23/3135; H01L 24/96; H01L 24/13; H01L 24/04
USPC ........................................................ 257/659
See application file for complete search history.

(56) References Cited

U.S. PATENT DOCUMENTS

| | | |
|---|---|---|
| 4,925,024 A | 5/1990 | Ellenberger et al. |
| 5,166,772 A | 11/1992 | Soldner et al. |
| 5,416,358 A | 5/1995 | Ochi et al. |

(Continued)

FOREIGN PATENT DOCUMENTS

| | | |
|---|---|---|
| KR | 10-0645755 | 11/2000 |
| KR | 10-1025408 | 12/2008 |

OTHER PUBLICATIONS

Adlam et al., "A Semiconductor Device Having RF Shielding and Method Therefor", U.S. Appl. No. 11/942,254, filed Nov. 19, 2007.

*Primary Examiner* — Luan C Thai
(74) *Attorney, Agent, or Firm* — McAndrews, Held & Malloy, Ltd.

(57) ABSTRACT

A semiconductor device and a method of manufacturing a semiconductor device. As a non-limiting example, various aspects of this disclosure provide a semiconductor device comprising one or more conductive shielding members and an EMI shielding layer, and a method of manufacturing thereof.

20 Claims, 5 Drawing Sheets

(51) Int. Cl.
*H01L 21/56* (2006.01)
*H01L 23/538* (2006.01)

(56) References Cited

U.S. PATENT DOCUMENTS

| | | | |
|---|---|---|---|
| 5,468,999 A | 11/1995 | Lin et al. | |
| 5,473,191 A | 12/1995 | Tanaka | |
| 5,557,142 A | 9/1996 | Gilmore et al. | |
| 5,614,694 A | 3/1997 | Gorenz, Jr. et al. | |
| 5,639,989 A | 6/1997 | Higgins, III | |
| 5,656,864 A | 8/1997 | Mitsue et al. | |
| 5,694,300 A | 12/1997 | Mattel et al. | |
| 5,907,477 A | 5/1999 | Tuttle et al. | |
| 5,940,271 A | 8/1999 | Mertol | |
| 6,136,131 A | 10/2000 | Sosnowski | |
| 6,194,655 B1 | 2/2001 | Lange, Sr. et al. | |
| 6,246,115 B1 | 6/2001 | Tang et al. | |
| 6,423,570 B1 | 7/2002 | Ma et al. | |
| 6,433,420 B1 | 8/2002 | Yang et al. | |
| 6,465,280 B1 | 10/2002 | Martin et al. | |
| 6,528,876 B2 | 3/2003 | Huang | |
| 6,602,737 B2 | 8/2003 | Wu | |
| 6,686,649 B1 | 2/2004 | Mathews et al. | |
| 7,030,469 B2 | 4/2006 | Mahadevan et al. | |
| 7,049,682 B1 | 5/2006 | Mathews et al. | |
| 7,071,550 B2 | 7/2006 | Sato | |
| 7,183,498 B2 | 2/2007 | Ogura et al. | |
| 7,342,303 B1 | 3/2008 | Berry et al. | |
| 7,629,674 B1 | 12/2009 | Foster | |
| 7,633,765 B1 | 12/2009 | Scanlan et al. | |
| 7,659,604 B2 | 2/2010 | Fujiwara et al. | |
| 7,745,910 B1 | 6/2010 | Olson et al. | |
| 7,799,602 B2 * | 9/2010 | Pagaila | H01L 21/565 438/106 |
| 7,851,894 B1 | 12/2010 | Scanlan | |
| 7,855,462 B2 | 12/2010 | Boon et al. | |
| 7,868,462 B2 | 1/2011 | Choi et al. | |
| 7,888,183 B2 | 2/2011 | Liu et al. | |
| 7,898,066 B1 | 3/2011 | Scanlan et al. | |
| 7,960,818 B1 | 6/2011 | Davis et al. | |
| 8,008,753 B1 | 8/2011 | Bolognia | |
| 8,012,868 B1 | 9/2011 | Naval et al. | |
| 8,030,722 B1 | 10/2011 | Bolognia et al. | |
| 8,093,691 B1 | 1/2012 | Fuentes et al. | |
| 8,199,518 B1 | 6/2012 | Chun et al. | |
| 8,222,538 B1 | 7/2012 | Yoshida et al. | |
| 8,247,889 B2 | 8/2012 | Liao et al. | |
| 8,299,610 B1 | 10/2012 | Berry et al. | |
| 8,362,597 B1 | 1/2013 | Foster | |
| 8,536,462 B1 | 9/2013 | Darveaux et al. | |
| 8,614,899 B2 | 12/2013 | Madsen et al. | |
| 8,623,753 B1 | 1/2014 | Yoshida et al. | |
| 8,872,312 B2 | 10/2014 | Wang et al. | |
| 8,897,028 B2 | 11/2014 | Takemura | |
| 8,946,886 B2 | 2/2015 | Fuentes et al. | |
| 9,055,682 B2 | 6/2015 | Mugiya et al. | |
| 9,070,793 B2 | 6/2015 | Liao et al. | |
| 9,144,183 B2 | 9/2015 | Chen | |
| 9,362,234 B2 | 6/2016 | Pabst | |
| 9,433,117 B1 | 8/2016 | Chun et al. | |
| 2002/0089832 A1 | 7/2002 | Huang | |
| 2003/0057545 A1 | 3/2003 | Shim et al. | |
| 2003/0067757 A1 | 4/2003 | Richardson et al. | |
| 2005/0073038 A1 | 4/2005 | Kuo et al. | |
| 2005/0280139 A1 | 12/2005 | Zhao et al. | |
| 2006/0208347 A1 | 9/2006 | Kim | |
| 2007/0030661 A1 | 2/2007 | Morris et al. | |
| 2007/0163802 A1 | 7/2007 | Manthei | |
| 2009/0146268 A1 | 6/2009 | Huang et al. | |
| 2010/0101841 A1 | 4/2010 | Fan | |
| 2010/0289716 A1 | 11/2010 | Lenzi et al. | |
| 2012/0008288 A1 | 1/2012 | Tsukamoto et al. | |
| 2012/0044653 A1 | 2/2012 | Morris et al. | |
| 2014/0016293 A1 | 1/2014 | Song et al. | |
| 2015/0036296 A1 | 2/2015 | Chen et al. | |
| 2015/0043172 A1 | 2/2015 | Mugiya et al. | |
| 2015/0049439 A1 | 2/2015 | Shimamura et al. | |
| 2015/0070849 A1 | 3/2015 | Shimamura et al. | |
| 2015/0108621 A1 | 4/2015 | Pabst | |
| 2016/0270213 A1 | 9/2016 | Salehi | |

\* cited by examiner

SEMICONDUCTOR DEVICE AND METHOD OF MANUFACTURING THEREOF

CROSS-REFERENCE TO RELATED APPLICATIONS/INCORPORATION BY REFERENCE

This application is a continuation of U.S. patent application Ser. No. 15/469,008, filed Mar. 24, 2017, and titled SEMICONDUCTOR DEVICE AND METHOD OF MANUFACTURING THEREOF, now U.S. Pat. No. 10,177,095, the entire contents of which are hereby incorporated herein by reference, in their entirety.

BACKGROUND

Present semiconductor devices and methods for manufacturing semiconductor devices are inadequate, for example resulting in manufacturing processes that are too time-consuming and/or too costly, resulting in semiconductor packages with unreliable connections and/or interconnection structures having suboptimal dimensions, etc. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
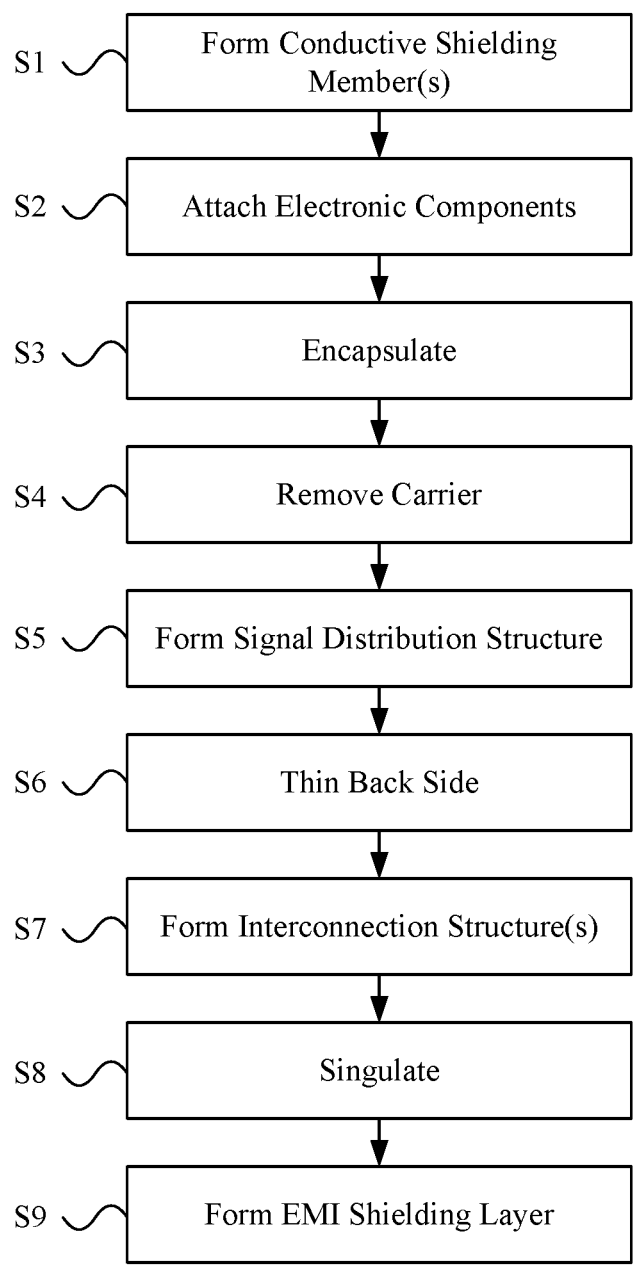
FIG. 1 shows a flow diagram of an example method of manufacturing a semiconductor device, in accordance with various aspects of the present disclosure.

Various aspects of this disclosure provide a semiconductor device and a method of manufacturing a semiconductor device. As a non-limiting example, various aspects of this disclosure provide a semiconductor device comprising one or more conductive shielding members and an EMI shielding layer, and a method of manufacturing thereof.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "above," "lower," "below," "side," "lateral," "horizontal," "vertical," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

It will also be understood that terms coupled, connected, attached, and the like include both direct and indirect (e.g., with an intervening element) coupling, connecting, attaching, etc., unless explicitly indicated otherwise. For example, if element A is coupled to element B, element A may be indirectly coupled to element B through an intermediate signal distribution structure, element A may be directly coupled to element B (e.g., adhered directly to, soldered directly to, attached by direct metal-to-metal bond, etc.), etc.

In the drawings, the dimensions of structures, layers, regions, etc. (e.g., absolute and/or relative dimensions) may be exaggerated for clarity. While such dimensions are generally indicative of an example implementation, they are not limiting. For example, if structure A is illustrated as being larger than region B, this is generally indicative of an example implementation, but structure A is generally not required to be larger than structure B, unless otherwise indicated. Additionally, in the drawings, like reference numerals may refer to like elements throughout the discussion.

Various electronic devices emit and/or receive electromagnetic waves. Unwanted electromagnetic waves may interfere with the operation of an electronic device. Thus, electronic device packages may be formed having an electromagnetic interference (EMI) shield. Such EMI shields may be formed to protect electronic devices outside of the electronic device package from electromagnetic interference caused by electronic devices within the package and/or to protect electronic devices within the electronic device package from electromagnetic interference caused by electronic devices outside of the package. Additionally, an electronic device package may include one or more EMI shields to protect electronic devices within the package from each other, for example forming one or more EMI shielded compartments within the electronic device package.

Various aspects of the present disclosure provide a method of manufacturing an electronic device, and an electronic device manufactured thereby, that comprises: forming a conductive shielding member on a top side of a carrier; attaching a first electronic component to the top side of the carrier; attaching a second electronic component to the top side of the carrier, wherein the conductive shielding member is positioned directly laterally between the first electronic component and the second electronic component; forming an encapsulating material that covers at least a portion of the top side of the carrier, at least a portion of a lateral side of the first electronic component, at least a portion of a lateral side of the second electronic component, and at least a portion of a lateral side of the conductive shielding member; forming a signal distribution structure on a respective bottom side of each of the encapsulating material, the first electronic component, the second electronic component, and the conductive shielding member; and forming an electromagnetic interference (EMI) shield layer on a top side of the encapsulating material and on a top side of the conductive shielding member, wherein the EMI shield layer is electrically coupled to the top side of the conductive shielding member.

In various example implementations, the method may comprise removing at least a portion of the carrier before said forming a signal distribution structure. Also for example, the conductive shielding member is wall-shaped. The method may, for example, comprise forming at least a plurality of additional conductive shielding members on the top side of the carrier, wherein the conductive shielding member and the additional conductive shielding members are positioned in a row, and wherein said forming the EMI shield layer comprises forming the EMI shield layer directly on respective top sides of the conductive shielding member and each of the plurality of additional conductive shielding members. In an example implementation, the conductive shielding member may be solder-free. For example, the conductive shielding member may be connected to the signal distribution structure without the use of solder, and the conductive shielding member is connected to the EMI shield layer without the use of solder. Additionally for example, forming an encapsulating material may comprise forming the encapsulating material to cover a top side of the first electronic component, a top side of the second electronic component, and a top side of the conductive shielding member. For example, prior to said forming the EMI shield layer, thinning the encapsulating material to expose at least the top side of the conductive shielding member. In an example implementation, said attaching the first electronic component comprises attaching a first component terminal of the first electronic component to the top side of the carrier; said attaching the second electronic component comprises attaching a second component terminal of the second electronic component to the top side of the carrier; the method may comprise removing the carrier, wherein after said removing the carrier, a respective bottom surface of each of the first component terminal, the second component terminal, the first conductive shielding member, and the encapsulating material are coplanar. In an example implementation, the encapsulating material may comprise a plurality of lateral sides, each of which coplanar with a respective lateral side of the signal distribution structure; and said forming the EMI shield layer may comprise forming the EMI shield layer on lateral sides of the encapsulating material and on lateral sides of the signal distribution structure.

Various aspects of the present disclosure provide a method of manufacturing an electronic device, and an electronic device manufactured thereby, that comprises: forming a conductive shielding member on a top side of a carrier, said conductive shielding member comprising a seed layer and at least one conductive layer formed on the seed layer; attaching a first component terminal of a first electronic component to the top side of the carrier; attaching a second component terminal of a second electronic component to the top side of the carrier, wherein the conductive shielding member is positioned directly laterally between the first electronic component and the second electronic component; forming an encapsulating material that covers at least a portion of the top side of the carrier, at least a portion of a lateral side of the first electronic component, at least a portion of a lateral side of the second electronic component, and at least a portion of a lateral side of the conductive shielding member; removing at least a portion of the carrier from a bottom side of the encapsulating material; forming a signal distribution structure on a respective bottom side of each of the encapsulating material, the first electronic component, the second electronic component, and the conductive shielding member; and forming an electromagnetic interference (EMI) shield layer on a top side of the encapsulating material and on a top side of the conductive shielding member, wherein the EMI shield layer is electrically coupled to the top side of the conductive shielding member.

In various example implementations, a respective surface of each of the first component terminal, the second component terminal, the conductive shielding member, and the encapsulating material are coplanar. Also for example, the seed layer may be laterally surrounded by the encapsulating material. In an example implementation, the conductive shielding member may be solder-free; the conductive shielding member may be connected to the signal distribution structure without the use of solder; and the first conductive shielding member is connected to the EMI shield layer without the use of solder. In an example implementation, said forming the encapsulating material may comprise forming the encapsulating material to cover a top side of the first electronic component, a top side of the second electronic component, and a top side of the conductive shielding member; and the method may comprise, prior to said forming the EMI shield layer, thinning the encapsulating material to expose at least the top side of the conductive shielding member. In an example implementation, the encapsulating material may comprise a plurality of lateral sides, each of which coplanar with a respective lateral side of the signal distribution structure; and said forming the EMI shield layer may comprise surrounding all lateral sides of the encapsulating material and of the signal distribution structure with the EMI shield layer.

Various aspects of the present disclosure provide an electronic device, and a method of manufacturing such an electronic device, that comprises: a first electronic component coupled to the top side of the signal distribution structure; a second electronic component coupled to the top side of the signal distribution structure; a conductive shielding member coupled to the top side of the signal distribution structure and positioned directly between the first and second electronic components; an encapsulating material that covers at least a portion of the top side of the signal distribution structure, at least a portion of lateral sides of the first and second electronic components, and at least a portion of lateral sides of the conductive shielding member; and an electromagnetic interference (EMI) shield layer on a top side of the encapsulating material and on a top side of the conductive shielding member, wherein the EMI shield layer is electrically coupled to the top side of the conductive shielding member.

In various example implementations, there might be no intervening layer between the first electronic component and the signal distribution structure, and no intervening layer between the second electronic component and the signal distribution structure. Also for example, the conductive shielding member may comprise a seed layer and a conductive layer formed on the seed layer; and a respective surface of each of the first electronic component, the second electronic component, the seed layer, and the encapsulating material are coplanar. In an example implementation, the conductive shielding member may be solder-free; the conductive shielding member may be connected directly to the signal distribution structure without the use of solder; and the conductive shielding member may be connected directly to the EMI shield layer without the use of solder.

Various aspects of the present disclosure provide a method of manufacturing a semiconductor device (or package), and a semiconductor device (or package) produced thereby, that comprises: forming a seed layer on a carrier and forming one or more conductive shielding members (e.g., a pillar, a wall, a fence, etc.) on the seed layer, attaching semiconductor dies having a plurality of conductive pads to the carrier at opposite sides of the conductive shielding member(s), encapsulating the conductive shielding member(s) and the semiconductor dies in an encapsulating material, forming a signal distribution structure electrically connected to the plurality of conductive pads, forming conductive interconnection structures on the signal distribution structure, and forming an electromagnetic interference (EMI) shielding layer on a surface of the encapsulant.

Various aspects of the present disclosure also provide a semiconductor device (or package), and a method of manufacturing thereof, comprising one or more conductive shielding members (e.g., a pillar, a wall, a fence, etc.), semiconductor dies formed at opposite side of the conductive shielding member(s) and having a plurality of conductive pads, an encapsulating material that encapsulates the conductive shielding member(s) and the semiconductor dies, a signal distribution structure electrically connected to the plurality of conductive pads, conductive interconnection structures attached to the signal distribution structure, and an electromagnetic interference (EMI) shielding layer on a surface of the encapsulating material.

In accordance with various aspects of the present disclosure a conductive shielding members (e.g., a pillar, a wall, a fence, etc.) is formed between semiconductor dies and an EMI shielding layer is formed on a surface of an encapsulating material and electrically connected to the conductive shielding member(s), thereby shielding electromagnetic waves generated by electronic components (e.g., semiconductor dies, etc.) of the electronic device package to prevent such electromagnetic waves from emanating to the outside of the electronic device package, shielding electromagnetic waves transmitted from devices outside of the electronic device package to prevent such electromagnetic waves from penetrating into the electronic device package, and shielding electromagnetic waves generated by electronic components of the electronic device package to present such electromagnetic waves from reaching other electronic components of the electronic device package.

FIG. 1 shows a flow diagram of an example method of manufacturing a semiconductor device, in accordance with various aspects of the present disclosure. FIGS. 2A-2I show cross-sectional views illustrating various steps of an example method of manufacturing a semiconductor device, in accordance with various aspects of the present disclosure. For example, FIGS. 2A-2I show cross-sectional views of an example semiconductor device during and after manufacturing in accordance with the example method 1000 of FIG. 1. The following discussion will generally refer to FIG. 1 and FIGS. 2A-2I together. Note that the following discussion will also, at times, refer to FIGS. 3A and 3B, which show plan views of example semiconductor devices (e.g., various aspects of example conductive shielding members, etc.).

Referring to FIG. 1, the example method 100 of manufacturing a semiconductor device may comprise: (S1) forming one or more conductive shielding members on a carrier, (S2) attaching electronic components to the carrier, (S3) encapsulating, (S4) removing the carrier, (S5) forming a signal distribution structure, (S6) performing back grinding, (S7) forming interconnection structures, (S8) singulating, and (S9) forming an electromagnetic interference (EMI) shielding layer.

Figure 2A:
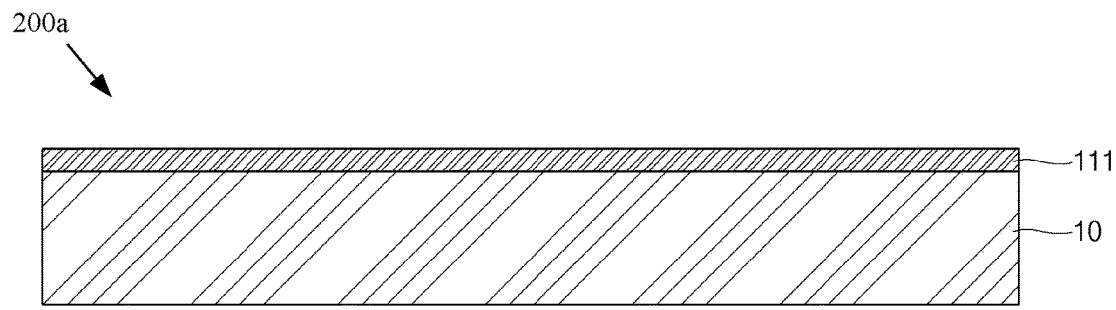
FIGS. 2A-2I show cross-sectional views illustrating various steps of an example method of manufacturing a semiconductor device, and a semiconductor device manufactured thereby, in accordance with various aspects of the present disclosure.
Figure 2B:
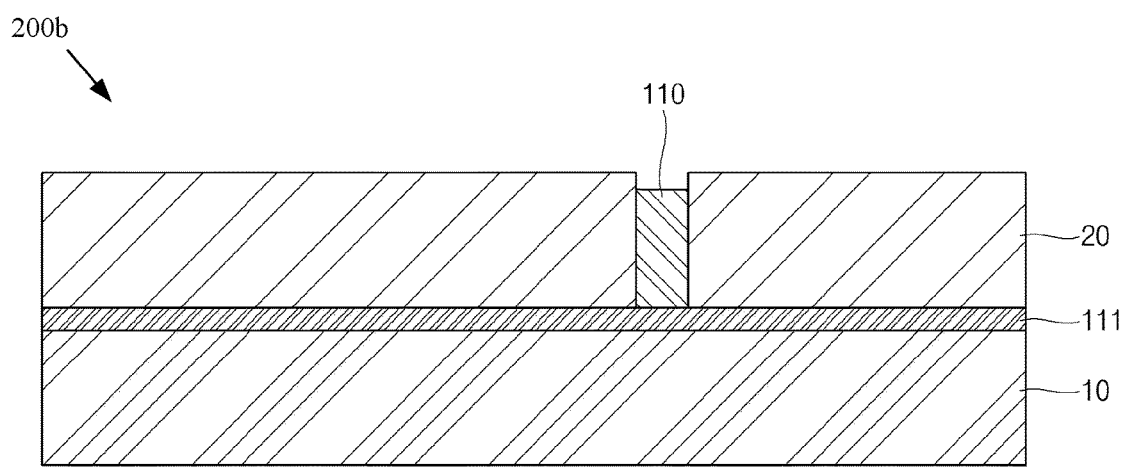
Figure 2C:
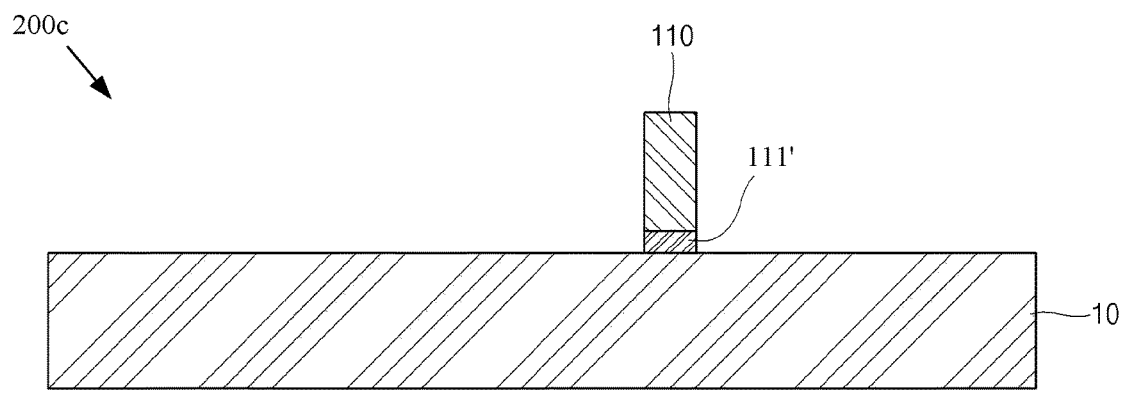

Referring to FIG. 1 and the example structures 200a, 200b, and 200c of FIGS. 2A, 2B, and 2C, the example method 1000 may, at block S1, comprise forming one or more conductive shielding members on a carrier. Block S1 may, for example, comprise receiving a carrier 10. Block S1 may, for example, comprise receiving the carrier 10 from an upstream manufacturing process, receiving the carrier 10 from a supplier at a different geographical location, etc.

The carrier 10 may comprise any of a variety of characteristics, non-limiting examples of which are provided herein. The carrier 10 may, for example, comprise a carrier (which may also be referred to herein as a substrate) for a single semiconductor device (or package) or may, for example, comprise a wafer or panel on which any number of semiconductor devices (or packages) may be formed. The carrier 10 may, for example, comprise a semiconductor (e.g., silicon, etc.) wafer or panel. The carrier 10 may also, for example, comprise a glass wafer or panel, a metal wafer or panel, a ceramic wafer or panel, a plastic wafer or panel, etc. Note that although this discussion of block S1 includes the forming of the conductive shielding member(s) on the carrier 10, the carrier 10 may also be received with such conductive shielding member(s) already formed thereon.

Figure 3A:
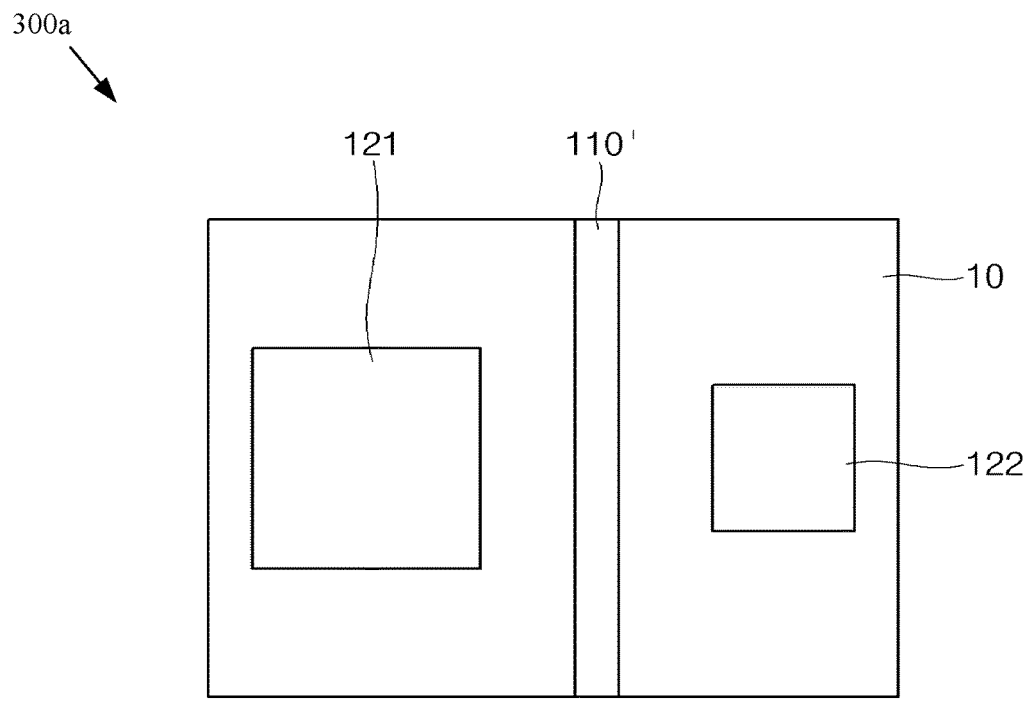
FIG. 3A shows a plan view of an example semiconductor device, in accordance with various aspects of the present disclosure.

Block S1 may, for example, comprise forming one or more conductive shielding members 110 on the carrier 10. The conductive shielding member(s) 110 may comprise any of a variety of shapes or characteristics. For example, as shown in FIG. 3A, the example conductive shielding member 110' may comprise a wall shape (or form). Though the example wall-shaped conductive shielding member 110' is shown extending entirely across the carrier 10 (or, for example, a portion of a carrier dedicated to a particular semiconductor device package) from a first side to an opposite side, the conductive shielding member 110' may extend between two adjacent sides (e.g., in a straight manner, in a semi-circular manner, in a triangular manner, etc.), the conductive shielding member 110' may extend to only one side of the carrier 10, the conductive shielding member 110' may extend to no sides of the carrier (e.g., positioned entirely within the perimeter of the carrier 10, positioned to encircle one or more electronic components, etc.), etc.

Though only one example wall-shaped conductive shielding member 110' is shown in FIG. 3A, a plurality of conductive shielding members may be formed, for example all having a same general shape or any combination of shapes discussed herein.

Figure 3B:
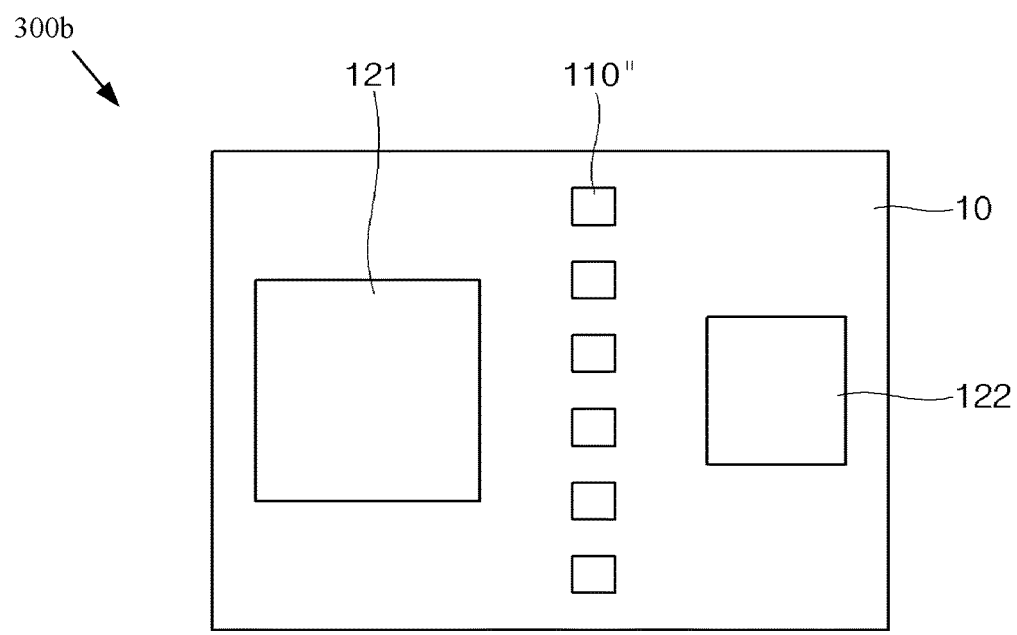
FIG. 3B shows a plan view of an example semiconductor device, in accordance with various aspects of the present disclosure.

Another example of a conductive shielding member (or plurality thereof) is shown in FIG. 3B. The example 300b comprises a plurality of pillar shaped (or post shaped) conductive shielding members 110" arranged in a row (e.g., spaced close enough to block EMI in a frequency range (or wavelength range) of interest). As with the wall-shaped conductive shielding member 100' of the example 300a of FIG. 3A, the conductive shielding members 110" may be arranged in a row (or pattern) that extends directly (or indirectly) between two opposites sides of the carrier 10 (or, for example, a portion of a carrier dedicated to a particular semiconductor device package), in a row (or pattern) that extends between two adjacent sides (e.g., in a straight manner, in a semi-circular manner, in a triangular manner, etc.), in a row (or pattern) that extends to no sides of the carrier (e.g., positioned entirely within the perimeter of the carrier 10, positioned to encircle one or more components, etc.), etc. Though not shown, in an example configuration in which there are lateral gaps between the conductive shielding members 110", conductive traces may be formed directly between adjacent conductive shielding members 110", for example to interconnect electronic components on opposite sides of the conductive shielding members 110".

In various example implementations, the one or more conductive shielding members 110 may have cylindrical shapes, truncated cone shapes, oval shapes, square shapes, rectangular shapes, straight vertical or vertically bent shapes, etc. (e.g., in horizontal plane or radial cross-sections, in vertical plane or longitudinal cross-sections, etc.). The conductive shielding members 110 may also, for example, comprise a flat upper end, a concave upper end, or a convex upper end. Accordingly, the scope of this disclosure should not be limited by characteristics of any particular conductive shielding member shape or pattern.

The one or more conductive shielding member(s) 110 may comprise any one or more of a variety of conductive materials (e.g., copper, aluminum, nickel, iron, silver, gold, titanium, chromium, tungsten, palladium, combinations thereof, alloys thereof, equivalents thereof, etc.), but the scope of the present disclosure is not limited thereto. In an example implementation, the one or more conductive shielding members 110 may comprise copper (e.g., pure copper, copper with some impurities, etc.), a copper alloy, etc. In an example implementation, the conductive shielding members 110 may also comprise one or more cap layers on the upper end. In an example implementation, the conductive shielding member(s) 110 may be solder-free. Additionally, the conductive shielding members(s) 110 may ultimately be connected to the signal distribution structure 155 (discussed herein) and to the EMI shield layer 170 without the utilization of solder, without the utilization of wire-bonding, etc.

Block S1 may comprise forming the conductive shielding member(s) 110 in any of a variety of manners (e.g., electroplating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto.

In the example 200a shown in FIG. 2A, block S1 comprises forming a seed layer 111 (or a plurality thereof) on the carrier 10. For example, the seed layer 111 may cover an entire top surface of the carrier 10. Note that the seed layer 111 may also be referred to herein as an underbump metallization (UBM) seed layer (e.g., in a scenario in which a UBM structure is formed thereon). The seed layer 111 may, for example, comprise any of a variety of conductive materials. For example, the seed layer 111 may comprise copper. Also for example, the seed layer 111 may comprise one or more layers of any of a variety of metals (e.g., silver, gold, aluminum, tungsten, titanium, nickel, molybdenum, etc.). Block S1 may comprise forming the seed layer 111 utilizing any of a variety of techniques (e.g., sputtering or other physical vapor deposition (PVD) technique, chemical vapor deposition (CVD), electroless plating, electroplating, etc.).

In the example 200b shown in FIG. 2B, block S1 comprises forming a mask 20 (or template) over the seed layer 111 to define one or more regions (or volumes) in which the one or more conductive shielding member(s) 110 are to be formed. For example, the mask 20 may comprise a photoresist (PR) material or other material (e.g., an organic dielectric material, an inorganic dielectric material, etc.), which may be patterned to cover regions other than the region(s) on which the one or more conductive shielding member(s) 110 are to be formed. Block S1 may then, for example, comprise forming the conductive shielding member(s) 110 on the seed layer 111 exposed through the mask 20 (e.g., by electroplating, etc.).

Though not shown, prior to forming the conductive shielding member(s) 110, an underbump metallization (UBM) structure comprising one or more UBM layers may be formed, for example on the region(s) of the seed layer 111 exposed through the mask 20. In such an example, the one or more UBM layers may comprise any of a variety of materials (e.g., titanium, chromium, aluminum, titanium/tungsten, titanium/nickel, copper, alloys thereof, equivalents thereof, etc.). Such one or more UBM layers may be formed on the seed layer 111 in any of a variety of manners (e.g., electroplating, electroless plating, sputtering, CVD, PVD, ALD, etc.).

In the example 200c shown in FIG. 2C, after forming the conductive shielding member(s) 110, block S1 may comprise stripping or removing the mask 20 (e.g., chemical stripping, ashing, etc.). Additionally, block S1 may comprise removing at least a portion of the seed layer 111 (e.g., at least the portion that is not covered by the conductive shielding member(s) 110 (e.g., by chemically etching, etc.). Note that during the removing (or etching) of the seed layer 111, a lateral edge portion of the seed layer 111 under the conductive shielding member(s) 110 may also be removed (or etched). Such removing (or under-etching) may, for example, result in an undercut beneath the conductive shielding member(s) 110 (and/or UBM structure if present). For example, in an example implementation in which a UBM structure and a respective conductive shielding member 110 are both formed over a same seed layer, the etching of such seed layer may result in an undercut beneath the UBM structure and/or beneath the conductive shielding member 110 formed thereon. Also for example, in an example implementation in which a conductive shielding member 110 is formed over a seed layer, the etching of such seed layer may result in an undercut beneath the conductive shielding member 110.

Figure 2D:
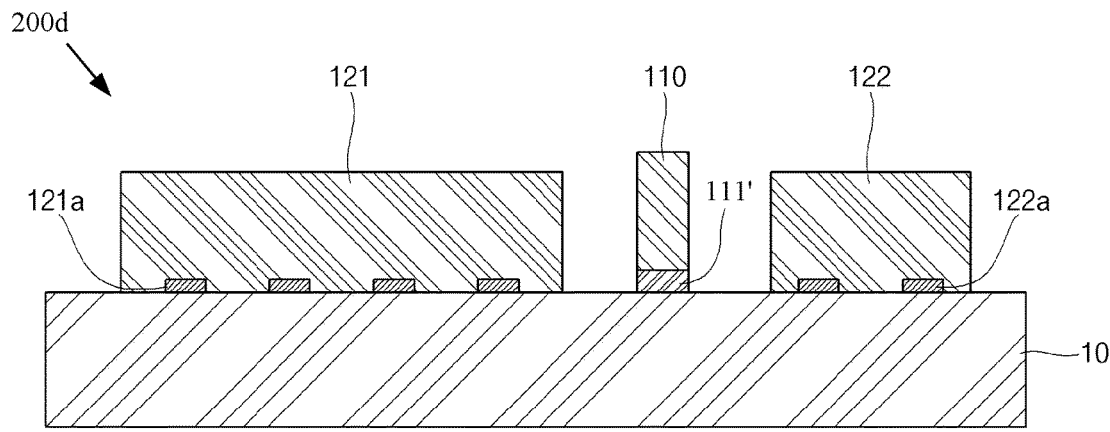

Referring to FIG. 1 and the example structure 200d of FIG. 2D, the example method 1000 may, at block S2, comprise attaching electronic components to the carrier. Block S2 may comprise performing such attaching in any of a variety of manners, non-limiting examples of which are provided herein.

The electronic components 121 and 122 (or any electronic component discussed herein) may comprise characteristics of any of a variety of types of electronic components. For example, any or all of the electronic components 121 and 122 (or any electronic component discussed herein) may comprise passive electronic components (e.g., resistors, capacitors, inductors, antenna elements, etc.), integrated passive devices (IPDs), etc. Also for example, any or all of the electronic components 121 and 122 may comprise active electronic components (e.g., semiconductor dies, transistors, etc.). For example, any or all of the electronic components 121 and 122 may comprise a processor die, microprocessor die, microcontroller die, co-processor die, general purpose processor die, application-specific integrated circuit die, programmable and/or discrete logic die, memory die, wired and/or wireless transceiver die, RF circuit, wireless baseband system-on-chip (SoC) processor die, sensor circuit, combination thereof, equivalent thereof, etc.

The example first electronic component 121 may comprise first component terminals 121a, and second electronic component 122 may comprise second component terminals 122a. Since the example electronic components 121 and 122 are shown and discussed as being semiconductor dies, the component terminals 121a and 122a may also be referred to herein as die pads 121a and 122a.

Block S2 may, for example, comprise attaching (or coupling) the electronic components 121 and 122 to the carrier 10 in any of a variety of manners, non-limiting examples of which are provided herein. For example, block S2 may comprise performing such attaching utilizing adhesive, vacuum pressure, etc.

In an example implementation, block S2 may comprise forming an adhesive layer or adhesive member (not shown) on the carrier 10 and/or on the electronic components 121 and 122. Such an adhesive layer may, for example comprise a layer of adhesive paste, a layer of liquid adhesive, a preformed double-sided adhesive tape or sheet (e.g., a die-attach tape), a printed adhesive, etc. Such an adhesive layer may, for example, partially or completely cover the top side of the carrier 10. Such an adhesive layer may also or alternatively, for example, partially or completely cover the bottom sides of the electronic components 121 and 122 (e.g., covering component terminals 121a and 122a, dielectric material between component terminals 121a and 122a, etc.).

Block S2 may comprise forming such an adhesive layer in any of a variety of manners. For example, block S2 may comprise forming the adhesive layer by applying a preformed sheet or film of the adhesive layer to the carrier 10 and/or to the electronic components 121 and 122, printing the adhesive layer on the carrier 10 and/or on the electronic components 121 and 122, spin-coating the adhesive layer on the carrier 10 and/or on the electronic components 121 and 122, dipping the carrier 10 and/or the electronic components 121 and 122 in an adhesive, spraying the adhesive layer on the carrier 10 and/or on the electronic components 121 and 122, etc.

In an example implementation, at least the component terminals 121a and 122a of the electronic components 121 and 122 may be placed in contact with an adhesive layer (or adhesion member) and thereby coupled to the carrier 10. In various example scenarios, the component terminals 121a and 122a (e.g., all or portions of lateral sides thereof) may be embedded in an adhesive layer, may be placed only on a top surface of an adhesive layer, etc. For example, in an example scenario in which the adhesive layer (or adhesion member), or a portion thereof, is vertically between the carrier 10 and the component terminals 121a and 122a, there may be a vertical displacement between a bottom end of the conductive shielding member(s) 110 (or seed layer beneath) and the bottom ends of the component terminals 121a and 122a. Also for example, in an example scenario in which the adhesive layer (or adhesion member) is not vertically between the carrier 10 and the component terminals 121a and 122a, the bottom end of the conductive shielding member(s) 110 (or seed layer beneath) and the bottom ends of the component terminals 121a and 122a may have no vertical displacement therebetween and/or may be coplanar.

Block S2 may comprise placing the electronic components 121 and 122 on the carrier 10 in any of a variety of manners (e.g., utilizing automated pick-and-place systems, manually placing, performing any combination of automated and manual placement, etc.).

As shown in FIGS. 3A and 3B, the electronic components 121 and 122 may be positioned on the carrier 10 on opposite sides of the conductive shielding structure(s) 110 (e.g., 110' of FIG. 3A, and 110" of FIG. 3B). Thus, the conductive shielding structure(s) 110, which traverse a region between the electronic components 121 and 122, provide for lateral EMI shielding between the electronic components 121 and 122.

Though only two electronic components 121 and 122 are shown, there may be any number of electronic components. Also, though only two sides of the conductive shielding structure(s) 110, for example resulting in two shielded regions, there may be any number of such shielded regions. For example, as discussed herein, the conductive shielding structure(s) 110 may be formed in any of a variety of patterns to form any or a variety of shapes, sizes, and numbers of shielded regions.

Note that although the drawings show the component terminals 121a and 122a (e.g., die pads, etc.) recessed into the first and second electronic components 121 and 122 (e.g., semiconductor dies, etc.), such recessing is not required. For example, the component terminals 121a and 122a may be formed to protrude from the bottom surfaces (e.g., active surfaces, etc.) of the first and second electronic components 121 and 122. More generally, the component terminals 121a and 122a may be formed to protrude from the bottom surfaces of the electronic components 121 and 122. Additionally, though not shown, a dielectric layer (or passivation layer) may be formed to cover peripheral lateral sides and/or peripheral areas of bottom sides of the component terminals 121a and 122a.

Figure 2E:
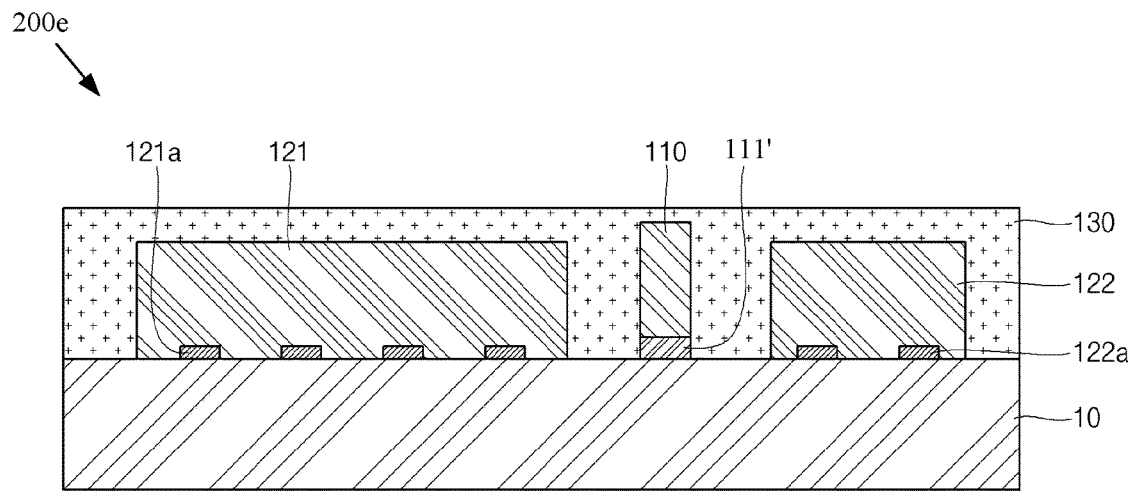

Referring next to FIG. 1 and the example structure 200e of FIG. 2E, the example method 1000 may, at block S3, comprise forming an encapsulating material. For example, block S3 may comprise covering the top side of the carrier 10 (and/or adhesive layer thereon, if present), various sides of the electronic components 121 and 122 (e.g., top sides, lateral sides, etc.), and various sides of the conductive shielding member(s) 110 (e.g., top sides, lateral sides, etc.) in an encapsulating material 130. Additionally, the encapsulating material 130 may cover any portion of bottom sides of the electronic components 121 and 122 (e.g., component terminals 121a and 122a, dielectric layers, etc.) that are not already covered by the carrier 10 (or adhesive layer if present). Note that any of the sides (e.g., top sides, lateral sides, bottom sides, etc.), or portions thereof, of one or more of the electronic components 121 and 122 may be left uncovered by the encapsulating material 130.

Block S3 may comprise forming the encapsulating material 130 in any of a variety of manners, non-limiting examples of which are provided herein. For example, block S3 may comprise forming the encapsulating material 130 utilizing one or more of compression molding, transfer molding, liquid encapsulant molding, vacuum lamination, paste printing, film assisted molding, glob top molding, flooding, etc. Also for example, block S3 may comprise forming the encapsulating material 130 utilizing one or more of spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.

The encapsulating material 130 may comprise one or more of a variety of encapsulating materials, non-limiting examples of which are provided herein. For example, the encapsulating material 130 may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). Also for example, the encapsulating material 130 may comprise any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a thermally curable epoxy molding compound, a room-temperature curable glob top molding compound, a phenolic resin, an epoxy, silicone, acrylate polymer, combinations thereof, equivalents thereof, etc.).

Note that the encapsulating material 130 may be originally formed to a desired thickness, but may also be thinned after forming (e.g., thinned while still covering the electronic components 121 and 122, thinned to expose a top surface of one or more of the electronic components 121 and 122, etc.). Such thinning, if performed, may be performed at any block of the example method 1000 (e.g., at block S6, etc.).

Figure 2F:
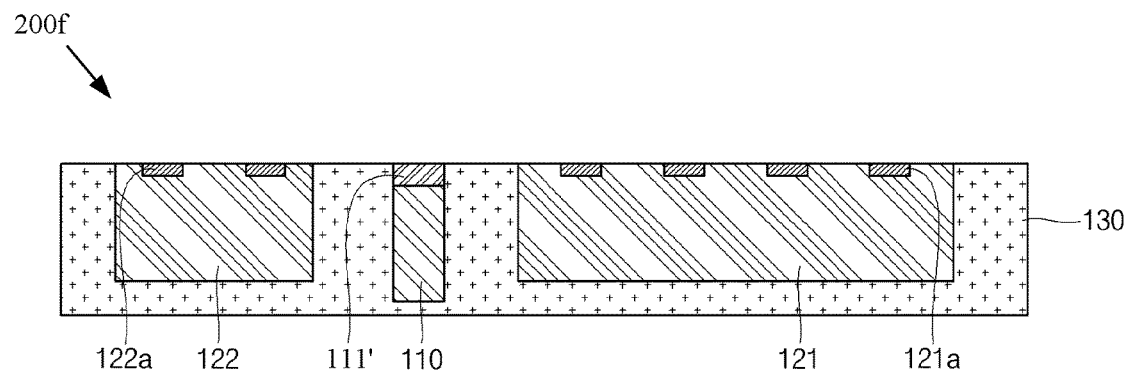

Referring next to FIG. 1 and the example structure 200f of FIG. 2F, the example method 1000 may, at block S4, comprise flipping (or turning over) the encapsulated structure 200e and removing the carrier 10 (and adhesive layer, if present). In an example implementation, though not shown in FIG. 2F, a second carrier (or tooling structure) may be coupled to the encapsulating material 130 (e.g., at a side opposite the carrier 10, etc.), and then the carrier 10 (and adhesive layer, if present) may be removed. Although the various examples presented herein shown the entire carrier 10 being removed, in various other example implementations, only a portion of the carrier 10 is removed (e.g., with apertures formed therein to provide electrically connectivity to the conductive shielding member(s) 110 and the component terminals 121a and 122a).

Block S4 may comprise removing the carrier 10 (and adhesive layer, if present), or a portion thereof, in any of a variety of manners, non-limiting examples of which are provided herein. For example, block S4 may comprise applying energy (e.g., thermal energy, laser energy, etc.) to the adhesive layer and/or the carrier 10 to release the adhesive layer. Additionally for example, block S4 may comprise peeling, sheering, and/or pulling the carrier 10 from the encapsulating material 130, conductive shielding member(s) 110, and electronic components 121 and 122. Further for example, block S4 may comprise grinding (or abrading) and/or chemically etching away the carrier 10 and/or adhesive layer.

Note that in various example scenarios, a portion of the component terminals 121a and 122a, a portion of the electronic components 121 and 122, a portion of the conductive shielding member(s) 110, and/or a portion of the encapsulating material 130 immediately adjacent to the carrier 10 (or adhesive layer) may also be removed (e.g., planarized, etc.). For example, after removal of the carrier 10 (and adhesive if present) or all of such component terminals 121a and 122a, electronic components 121 and 122, conductive shielding member(s) 110, and encapsulating material 130 may be coplanar. In an example scenario block S4 may also comprise removing some or all of the seed layer 111'. For example, though the example 200f of FIG. 2F shows at least a portion of the seed layer 111' remaining after removal of the carrier 10, in other example implementations the entire seed layer 111a may be removed.

Note that the removal of the carrier 10 (and the adhesive layer, if present) may expose the side of the encapsulating material 130 that was previously covered by the carrier 10 (or adhesive layer), and may also expose sides of the component terminals 121a and 122a that were previously covered by the carrier 10 (and adhesive layer) (e.g., for example the sides facing the carrier 10, lateral sides that may have been embedded in the adhesive layer, etc.). Note that depending on the geometry of the electronic components 121 and 122 and/or component terminals 121a and 122a, the removal of the carrier 10 (and the adhesive layer, if present) may also expose portions of the electronic components 121 and 122 in addition to the component terminals 121a and 122a.

Figure 2G:
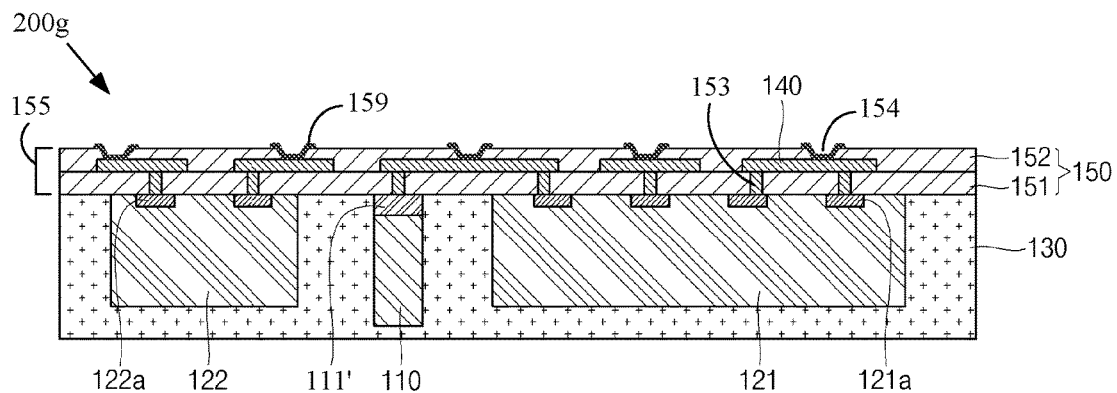

Referring next to FIG. 1 and the example structure 200g of FIG. 2G, the example method 1000 may, at block S5, comprise forming a signal distribution structure 155 on the encapsulating material 130, on the electronic components 121 and 122 (and/or component terminals 121a and 122a thereof). The example signal distribution structure 155 shown in FIGS. 2G-2I comprises a plurality of dielectric layers 150 (e.g., a first dielectric layer 151 comprising first apertures 153, and a second dielectric layer 152 comprising second apertures 154), and a conductive layer 140. The signal distribution structure 155 may, however, comprise any number of dielectric and conductive layers.

Block S5 may comprise forming the signal distribution structure 155 in any of a variety of manners, non-limiting examples of which are provided herein. For example, block S5 may share any or all characteristics with generally analogous blocks (and/or the resulting structures) shown in U.S. patent application Ser. No. 14/823,689, filed on Aug. 11, 2016, and titled "Semiconductor Package and Fabricating Method Thereof," the entirety of which is hereby incorporated herein by reference in its entirety for all purposes.

Block S5 may, for example, comprise forming and patterning one or more dielectric layers and one or more conductive layers to form the signal distribution structure 155. Note that the signal distribution structure 155 may also be referred to as a redistribution layer, a redistribution layer stack, a redistribution structure, an interposer, etc.

Block S5 may, for example, comprise forming the signal distribution structure 155 having any number of dielectric layers and conductive layers (e.g., signal distribution layers, redistribution layers, pad layers, conductive vias, under-bump metallization, land layers, etc.). In an example implementation, block S5 may comprise forming a signal distribution structure 155 comprising a first dielectric layer 151 comprising one or more first apertures 153, a conductive layer 140 (e.g., a conductive via, a pad or land layer, a trace layer, etc.), and a second dielectric layer 152 comprising one or more second apertures 154. Block S5 (or block S7, etc.) may also comprise forming an under bump metallization (UBM) structure 159 (or layer), for example in the second apertures 154 and/or on the second dielectric layer 152 around the perimeter of the second apertures 154.

For example, block S5 may comprise forming the first dielectric layer 151 utilizing any one or more of a variety of processes (e.g., spin coating, spray coating, printing, sintering, thermal oxidation, physical vapor deposition (PVD), chemical vapor deposition (CVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

The first dielectric layer 151 may comprise one or more layers of any of a variety of dielectric materials, for example inorganic dielectric materials (e.g., $Si_3N_4$, $SiO_2$, SiON, SiN, oxides, nitrides, combinations thereof, equivalents thereof, etc.) and/or organic dielectric materials (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

Block S5 may, for example, also comprise patterning the first dielectric layer 151, for example forming first apertures 153 therein that expose the components terminals 121a and 122a of the electronic components 121 and 122. For example, block S5 may comprise ablating first apertures 153 (e.g., utilizing laser ablation, utilizing mechanical ablation, utilizing chemical ablation (or etching), etc.). Also for example, block S5 may comprise originally forming the first dielectric layer 151 (e.g., depositing, etc.) having the desired first apertures 153 (e.g., utilizing a masking and/or printing process, etc.). Though shown with vertical sides, the first apertures 153 may have sloped sides, for example having a narrower end toward the component terminals 121a and 122a, and a wider end away from the component terminals 121a and 122a. The sloped sides may, for example, facilitate the formation of conductive structures therein (e.g., conductive vias, conductive layers, under bump metallization layers, conductive interconnection structures, etc.).

Block S5 may comprise forming the first conductive layer 140 (e.g., a conductive via layer, a pad or land layer, a trace layer, etc.) in any of a variety of manners, non-limiting examples of which are provided herein. For example, block S5 may comprise forming the first conductive layer 140 utilizing any one or more of a variety of processes (e.g., electroplating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto. Block S5 may, for example, comprise forming the first conductive layer 140 comprising conductive vias in the first apertures 153 of the first dielectric layer 151, for example on top sides of the component terminals 121a and 122a of the electronic components 121 and 122. Block S5 may also, for example, comprise forming traces on the first dielectric layer 151 (and/or in channels formed herein). Such traces may, for example, extend laterally from the conductive vias.

As with any of the conductive layers discussed herein, block S5 may comprise forming one or more seed layers as part of the processing of forming the first conductive layer 140 (e.g., prior to electroplating the first conductive layer 140, etc.). For example, though not shown in FIG. 2G, block S5 may comprise forming one or more seed layers on the top surface of the component terminals 121a and 122a, on aperture sidewalls of the first apertures 153 through the first dielectric layer 151, on the top surface of the first dielectric layer 151, etc.

The first conductive layer 140, which may also be referred to herein as a pad, a via, a trace, a land, a bond pad layer, a conductive layer, a trace layer, a redistribution layer, etc., may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto.

Block S5 may, for example, comprise forming a second dielectric layer 152 on the first dielectric layer 151 (or portions thereof) and/or on the first conductive layer 140 (or portions thereof). Block S5 may, for example, comprise forming the second dielectric layer 152 in any of a variety of manners, for example any of the manners discussed herein with regard to the first dielectric layer 151. For example, block S5 may comprise forming the second dielectric layer 152 in the same manner as the first dielectric layer 151, or in a different manner. The second dielectric layer 152 may, for example, comprise any of the characteristics discussed herein with regard to the first dielectric layer 151. The second dielectric layer 152 may, for example, be formed of the same dielectric material as the first dielectric layer 151, or of a different dielectric material.

As with the first dielectric layer 151, block S5 may comprise patterning the second dielectric layer 152 in any of a variety of manners. For example, block S5 may comprise forming second apertures 154 in the second dielectric layer 152 to expose pads, lands, or traces of the first conductive layer 140, for example for establishing electrical contact with other conductive layers, with under bump metallization layers, with interconnection structures (e.g., as formed at block S7, etc.). As discussed herein with regard to the first apertures 153, the second apertures 154 may have sloped sides, for example having a narrower end toward the electronic components 121 and 122, and a wider end away from the electronic components 121 and 122. The sloped sides may, for example, facilitate the formation of various conductive structures in the second apertures 154 (e.g., under bump metallization layers, conductive interconnection structures, conductive vias, conductive layers, etc.).

Note that block S5 may comprise forming the signal distribution structure 155 to have any number of conductive and/or dielectric layers, for example one or more conductive layers, one or more dielectric layers, etc. Also note that the configuration of the signal distribution structure 155 shown in the various figures herein is merely exemplary and not limiting. For example, the signal distribution structure 155 (or conductive layers thereof) may provide electrical paths directly vertically or indirectly (e.g., vertically and horizontally, etc.) through the signal distribution structure 155, for example between the first electronic component 121, the second electronic component 122, and/or conductive shielding member(s) 110 (or other components) to/from other components on the opposite side of the signal distribution structure 155. Also for example, the signal distribution structure 155 (or conductive layers thereof) may provide lateral (or horizontal) electrical pathways through the signal distribution structure 155, for example between the first electronic component 121 and the second electronic component 122, between the first electronic component 121 and the conductive shielding member(s) 110, between the second electronic component 122 and the conductive shielding member(s) 110, between other components and any or all of the first electronic component 121, the second electronic component 122, and the conductive shielding member(s) 110, etc.

In various example implementations, block S5 may also, for example, comprise forming one or more under bump metallization (UBM) structures 159 (or layer) on the first conductive layer 140 and/or on the second dielectric layer 152 (e.g., on portions of the second dielectric layer 152 around the perimeter of the second apertures 154 in the second dielectric layer 152 through which the conductive layer 140 is exposed, etc.). For example, block S5 may comprise forming the UBM structure(s) 159 to have one or more metallization layers conducive to the attachment (or formation) of interconnection structures (e.g., conductive balls, conductive pillars or posts, etc.), for example as formed and/or attached at block S7. The UBM structure 159 may, for example, be exposed at the top surface of the signal distribution structure 155 (e.g., as oriented in FIG. 2G). A UBM structure(s) 159 may also be referred to herein as a land or pad.

Block S5 may comprise forming the UBM structure(s) 159 in any of a variety of manners, non-limiting examples of which are provided herein. In an example implementation, block S5 may comprise forming a UBM seed layer of the UBM structure(s) 159 over the second dielectric layer 152 and/or over the portions of the conductive layer 140 (e.g., a pad or land, a trace, etc.) that are exposed through the second apertures 154 in the second dielectric layer 152. The UBM seed layer may, for example, comprise any of a variety of conductive materials (e.g., copper, gold, silver, metal, etc.). The UBM seed layer may be formed in any of a variety of manners (e.g., sputtering, electroless plating, chemical vapor deposition (CVD), physical vapor deposition (PVD), atomic layer deposition (ALD), plasma vapor deposition, etc.).

Block S5 may, for example, comprise forming a mask (or template) over the UBM seed layer to define a region (or volume) in which one or more additional UBM layers of the UBM structure(s) 159 (or other interconnection structure) are to be formed. For example, the mask may comprise a photoresist (PR) material or other material, which may be patterned to cover regions other than the region(s) on which the UBM layer(s) (and/or other interconnection structure) are to be formed. Block S5 may then, for example, comprise forming one or more UBM layers on the UBM seed layer exposed through the mask. The UBM layer(s) may comprise any of a variety of materials (e.g., titanium, chromium, aluminum, titanium/tungsten, titanium/nickel, copper, alloys thereof, etc.). Block S5 may comprise forming the UBM layer(s) on the UBM seed layer, or without using a UBM seed layer, in any of a variety of manners (e.g., electroplating, sputtering, electroless plating, chemical vapor deposition (CVD), physical vapor deposition (PVD), atomic layer deposition (ALD), plasma vapor deposition, etc.).

Note that in various example implementations, the UBM structure(s) 159 might not be formed. For example as discussed below, the conductive interconnection structures 160 may be attached directly to the conductive layer 140 without any intervening layers.

In general, block S5 may comprise forming a signal distribution structure 155 (or interposer). Accordingly, the scope of the present disclosure should not be limited by characteristics of any particular signal distribution structure or by characteristics of any particular manner of forming such a signal distribution structure.

Figure 2H:
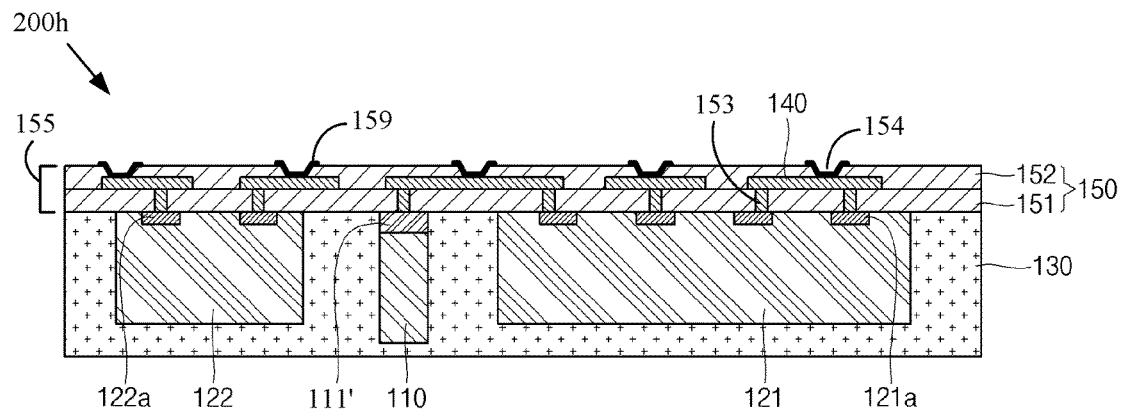

Referring next to FIG. 1 and the example structure 200h of FIG. 2H, the example method 1000 may, at block S6, comprise thinning (or planarizing) the assembly (e.g., the assembly 200g of Figure G). Block S6 may comprise performing such thinning (or planarizing) (e.g., back side thinning) in any of a variety of manners, non-limiting examples of which are provided herein. Note that such thinning may be performed at any of a variety of blocks of the example method 1000.

For example, block S6 may comprise thinning (e.g., mechanically grinding, chemically etching, shaving or shearing, peeling, any combination thereof, etc.) the encapsulating material 130 to a desired thickness. For example, a side of the encapsulating material 130 opposite the side facing the signal distribution structure 155 may be the primary focus of such grinding. Such side is shown at the bottom side of the assembly 200h of FIG. 2H.

Block S6 may also, for example, comprise thinning (e.g., mechanically grinding, chemically etching, shaving, peeling, any combination thereof, etc.) the conductive shielding member(s) 110. In the example implementation 200h shown in Figure H, block S6 comprises performing the thinning in a manner that results in coplanar surfaces of the encapsulating material 130 and the conductive shielding member(s) 110, for example leaving the back sides of the electronic components 121 and 122 covered by the encapsulating material 130. Thus, at least the end surface(s) (and/or at least an upper portion of lateral side surfaces) of the conductive shielding member(s) 110, are exposed from (or at) the surface of the encapsulating material 130. Note that while the example implementation 200h of FIG. 2H shows the back sides of the electronic components 121 and 122 covered by the encapsulating material 130, one or both of such back sides may be exposed from (or at) the surface of the encapsulating material 130.

In various example implementations, blocks S1-S9 (and/or the resulting structure) may share any or all characteristics with generally analogous blocks (and/or the resulting structures) shown in U.S. patent application Ser. No. 14/823,689, filed on Aug. 11, 2016, and titled "Semiconductor Package and Fabricating Method Thereof," the entirety of which is hereby incorporated herein by reference in its entirety for all purposes.

Referring next to FIG. 1 and the example structure 200h of FIG. 2H, the example method 1000 may, at block S7, comprise forming one or more conductive interconnection structures. Block S7 may comprise forming such interconnection structure(s) in any of a variety of manners, non-limiting examples of which are provided herein.

As discussed herein, the second dielectric layer 152 may comprise second apertures 154 through which electrical connection to the conductive layer 140 may be achieved. Also as discussed above, UBM structures 159 may be formed in and/or around such second apertures 154. Block S7 may, for example, comprise forming the conductive interconnection structures 160 on the conductive layer 140 (e.g., through respective apertures 154 through the second dielectric layer 152) and/or on portions of the second dielectric layer 152 (e.g., surrounding the respective apertures 152 through the second dielectric layer 154). Block S7 may, for example, comprise forming the conductive interconnection structure(s) 160 directly on the second conductive layer 140 or directly on UBM structures 159(s).

The conductive interconnection structures 160 (e.g., package interconnection structures, module interconnection structures, etc.) may comprise any of a variety of characteristics. For example, a conductive interconnection structure 160 may comprise a conductive ball or bump (e.g., a solder ball or bump, wafer bump, a solid core or copper core solder ball, etc.). For example, in an example implementation including a solder ball or bump, such balls or bumps may comprise tin, silver, lead, Sn—Pb, $Sn_{37}$—Pb, $Sn_{95}$—Pb, Sn—Pb—Ag, Sn—Pb—Bi, Sn—Cu, Sn—Ag, Sn—Au, Sn—Bi, Sn—Ag—Cu, Sn—Ag—Bi, Sn—Zn, Sn—Zn—Bi, eutectic solders, high-lead solders having a high melting point, lead-free solders, combinations thereof, equivalents thereof, etc., but the scope of this disclosures is not limited thereto. A conductive interconnection structure 160 may also comprise a conductive pillar or post, a wire, a land, etc., which may for example comprise any of the conductive materials (e.g., metals, conductive adhesives, etc.) discussed herein.

The conductive interconnection structures 160 may be configured in any or a variety of configurations. For example, the conductive interconnection structures 160 may be configured in a ball grid array configuration, a land grid array configuration, etc. The conductive interconnection structures 160 may, for example, be arranged around a perimeter around the semiconductor package (e.g., surrounding a footprint (or outline) of the first electronic component 121 and/or second electronic component 122). The conductive interconnection structure 160 may also, for example, be arranged in a row/column matrix array (e.g., where at least a portion of the matrix/array is within the footprint (or outline) of the first electronic component 121 and/or the second electronic component 122).

Block S7 may comprise forming (or attaching) such conductive interconnection structures 160 in any of a variety of manners, non-limiting examples of which are provided herein. For example, block S7 may comprise forming (or attaching) such conductive interconnection structures 160 by ball-dropping, bumping, metal-plating, pasting and reflowing, etc. For example, block S7 may comprise dropping a conductive ball on the conductive layer 140 (e.g., directly on the conductive layer, directly on a UBM structure 159 formed on the conductive layer 140, etc.). In an example implementation, block S7 may comprise dotting volatile flux on the UBM structure(s) 159, dropping conductive balls (or bumps) 160 on the flux, and then providing a reflow temperature in a range of about 150 degrees C. to about 250 degrees C. (e.g., volatizing and removing the flux). Block S7 may, for example, share any or all characteristics with block S1 (e.g., the forming of the conductive shielding member(s) 110).

Though not shown, block S7 may also, for example, comprise forming (or attaching) additional components (e.g., passive components, active components, etc.) laterally between the conductive interconnection structures 160. In an example implementation, such components may have a smaller height than the conductive interconnection structures 160. For example, such components may have a smaller height than a solder ball conductive interconnection structure 160, a smaller height than a solid core (e.g., a copper core, etc.) of a solder ball interconnection structure 160, etc. In such an implementation, the conductive interconnection structures 160 may provide a standoff to maintain space for such components when the conductive interconnection structures 160 are attached to another substrate or component.

Figure 2I:
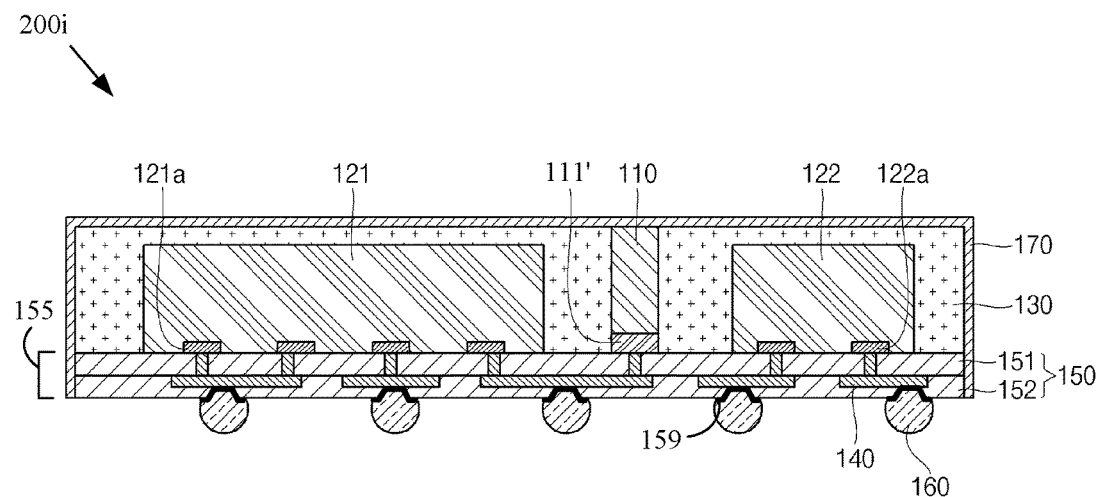

Referring next to FIG. 1 and the example structure 200*i* of FIG. 2I, the example method 1000 may, at block S8, comprise singulating an electronic package from a wafer or panel or otherwise connected plurality of electronic packages. Block S8 may comprise performing such singulating in any of a variety of manners, non-limiting examples of which are provided herein.

For example, as discussed herein, any or all of the blocks of the example method 1000 may be performed at a wafer or panel level, for example forming a plurality of electronic devices (or packages) at the same time. The wafer or panel may then, for example, be singulated into individual packages. Such singulating may, for example, be performed by any one or more of mechanical cutting (e.g., sawing, cutting, abrading, snapping, etc.), energy cutting (e.g., laser cutting, plasma cutting, etc.), chemical cutting (e.g., etching, dissolving, etc.), etc. In an example implementation, such singulating may form coplanar lateral side surfaces of the electronic device (or package). For example, one or more of the lateral side surfaces of the encapsulating material 130 and the signal distribution structure 155 (e.g., the first dielectric layer 151, the second dielectric layer 152, and/or the conductive layer 140) may be coplanar on one or more lateral sides of the singulated electronic device (or package) 200*i*.

Additionally, in an example configuration in which one or more sides of the conductive shielding member(s) 110 extend to lateral sides of the singulated electronic device, block S8 may also comprise cutting through one or more portions of the conductive shielding member(s) 110. Such cutting may, for example, result in lateral sides of the conductive shielding member(s) 110 having exposed sides that are coplanar with lateral sides of the encapsulating material 130 and/or with lateral sides of the signal distribution structure 155.

Note that the singulating may alternatively be performed after block S9. In such case, the lateral side surfaces might be left uncovered by the EMI shielding layer 170 discussed below, or such layer 170 may be formed on lateral side surfaces and/or on portions of the bottom surface after singulation.

Referring next to FIG. 1 and the example structure 200*i* of FIG. 2I, the example method 1000 may, at block S9, comprise singulating an electronic package from a wafer or panel or otherwise connected plurality of electronic packages. Block S8 may comprise performing such singulating in any of a variety of manners, non-limiting examples of which are provided herein.

Block S9 may, for example, comprising forming an electromagnetic interference (EMI) shielding layer 170 on top and lateral surfaces of the encapsulant 130 and/or on top surface(s) (or any exposed surface) of the conductive shielding member(s) 110 exposed from the encapsulant 170. Block S8 may also, for example, comprise forming the EMI shielding layer 170 on lateral side surfaces of the encapsulant 130 and lateral side surfaces of the signal distribution structure 155 (e.g., lateral side surfaces of the first dielectric layer 151, of the second dielectric layer 152, of the conductive layer 140 if exposed, etc.).

The EMI shielding layer 170 may, for example, be formed directly on at least a top surface of each of the one or more conductive shielding member(s) 110, and thus be electrically connected thereto. In an example implementation, the EMI shielding layer 170 and the conductive shielding member(s) 110 may be electrically connected to a ground connection (or other constant-potential conductor). The EMI shielding layer 170 may shield electromagnetic waves generated from the electronic components 121 and 122 (or any components in the encapsulating material 130) to prevent such electromagnetic waves from emanating to the outside, and may shield electromagnetic waves transmitted from the outside to prevent such electromagnetic waves from penetrating the electronic package to the electronic components 121 and 122. In addition, the conductive shielding member(s) 110 may prevent EMI from occurring between the first electronic component 121 and the second electronic component 122.

Block S9 may, for example, comprise forming the EMI shielding layer 170 by coating conductive paste that comprises conductive metal powder on the encapsulant 130 (e.g., by spray coating, sputtering, etc.), by spraying or vapor-depositing an electrically conductive pant, by utilizing any or all of the process steps discussed herein with regard to the formation of the conductive layer 140, etc.), but the scope of the present disclosure is not limited thereto.

In summary, various aspects of this disclosure provide a semiconductor device and a method of manufacturing a semiconductor device. As a non-limiting example, various aspects of this disclosure provide a semiconductor device comprising one or more conductive shielding members and an EMI shielding layer, and a method of manufacturing thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. An electronic device comprising:
   a signal distribution structure (SDS) having a top SDS side and a bottom SDS side, and at least a first SDS conductive layer;
   a first electronic component coupled to the top SDS side and comprising a first component terminal on which a first portion of the first conductive layer is directly formed;
   a second electronic component coupled to the top SDS side and comprising a second component terminal on which a second portion of the first conductive layer is directly formed;
   a conductive shielding member (CSM) coupled to the top SDS side and positioned directly between the first and second electronic components;
   an encapsulating material that covers at least a portion of the top side of the signal distribution structure, at least a portion of lateral sides of the first and second electronic components, and at least a portion of lateral sides of the conductive shielding member; and
   an electromagnetic interference (EMI) shield layer on a top side of the encapsulating material and on a top side of the conductive shielding member, wherein the EMI shield layer is electrically coupled to the top side of the conductive shielding member.

2. The electronic device of claim 1, wherein there is no intervening layer between a bottom side of the first electronic component and the signal distribution structure, and no intervening layer between a bottom side of the second electronic component and the signal distribution structure.

3. The electronic device of claim 1, wherein:
   the conductive shielding member (CSM) comprises a CSM seed layer and a CSM conductive layer plated directly on the CSM seed layer;
   a top end of the CSM conductive layer is coplanar with a top side of the encapsulating material; and
   a respective surface of each of the first electronic component, the second electronic component, the CSM seed layer, and the encapsulating material are coplanar.

4. The electronic device of claim 1, wherein:
   the conductive shielding member (CSM) comprises a CSM seed layer and a CSM conductive layer plated directly on the CSM seed layer; and
   a bottom end of the CSM conductive layer is vertically higher than a bottom side of the first electronic component.

5. The electronic device of claim 1, wherein no portion of the EMI shield layer is directly between the signal distribution structure (SDS) and the encapsulating material.

6. An electronic device comprising:
   a signal distribution structure (SDS) having a top SDS side and a bottom SDS side, and at least a first SDS conductive layer;
   a first electronic component coupled to the top SDS side and comprising a first component terminal coupled to the first SDS conductive layer, the first component terminal on a bottom side of the first electronic component;
   a second electronic component coupled to the top SDS side and comprising a second component terminal coupled to the first SDS conductive layer, the second component terminal on a bottom side of the second electronic component;
   a conductive shielding member (CSM) coupled to the top SDS side and positioned directly between the first and second electronic components, wherein a bottom side of the conductive shielding member is vertically higher than bottom side of the first electronic component;
   an encapsulating material that covers at least a portion of the top SDS side, at least a portion of lateral sides of the first and second electronic components, and at least a portion of lateral sides of the conductive shielding member; and
   an electromagnetic interference (EMI) shield layer on a top side of the encapsulating material and on a top side of the conductive shielding member, wherein the EMI shield layer is directly coupled to the top side of the conductive shielding member.

7. The electronic device of claim 6, wherein the conductive shielding member comprises a seed layer coupled directly to the top SDS side.

8. The electronic device of claim 7, wherein the encapsulating material laterally surrounds the seed layer.

9. The electronic device of claim 6, wherein the encapsulating material laterally surrounds the entire conductive shielding member.

10. The electronic device of claim 9, wherein the encapsulating material comprises a molded material that is molded around the conductive shielding member.

11. The electronic device of claim 6, wherein the signal distribution structure (SDS) comprises a dielectric layer that is deposited directly on the first component terminal and directly on the second component terminal.

12. The electronic device of claim 11, wherein the dielectric layer is deposited directly on the conductive shielding member (CSM).

13. The electronic device of claim 6, wherein a top side of the conductive shielding member (CSM) is coplanar with a top side of the encapsulating material.

14. An electronic device comprising:
   a signal distribution structure (SDS) having a top SDS side and a bottom SDS side, and at least a first SDS conductive layer;

a first electronic component coupled to the top SDS side and comprising a first component terminal coupled to the first SDS conductive layer by a solderless and adhesiveless connection;

a second electronic component coupled to the top SDS side and comprising a second component terminal coupled to the first SDS conductive layer by a solderless and adhesiveless connection;

a conductive shielding member (CSM) coupled to the top SDS side by a solderless and adhesiveless connection and positioned directly between the first and second electronic components;

an encapsulating material that covers at least a portion of the top SDS side, at least a portion of lateral sides of the first and second electronic components, and at least a portion of lateral sides of the conductive shielding member; and an electromagnetic interference (EMI) shield layer on a top side of the encapsulating material and on a top side of the conductive shielding member, wherein the EMI shield layer is coupled to the top side of the conductive shielding member.

15. The electronic device of claim 14, wherein the signal distribution structure (SDS) comprises an SDS dielectric layer that is deposited directly on the first component terminal, directly on the second component terminal, and directly on the conductive shielding member.

16. The electronic device of claim 15, wherein there is no intervening layer between the SDS dielectric layer and the first electronic component and no intervening layer between the SDS dielectric layer and the second electronic component.

17. The electronic device of claim 14, wherein the conductive shielding member (CSM) comprises a plurality of metal layers laterally surrounded by the encapsulating material.

18. The electronic device of claim 17, wherein the plurality of metal layers comprise an electroplating seed layer, and an electroplated metal layer.

19. The electronic device of claim 14, comprising a second conductive shielding member coupled to the top SDS side and positioned directly between the first and second electronic components.

20. The electronic device of claim 14, wherein the signal distribution structure (SDS) comprises a plurality of dielectric layers sequentially built up on the first electronic component, on the second electronic component, on the conductive shielding member, and on the encapsulating material.

* * * * *